(12) United States Patent
Zhou

(10) Patent No.: US 12,025,819 B2
(45) Date of Patent: Jul. 2, 2024

(54) PICOMETER OPTICAL COMB, AND DEVICE AND METHOD FOR GENERATING THE SAME

(71) Applicant: Shanghai Institute of Optics And Fine Mechanics, Chinese Academy of Sciences, Shanghai (CN)

(72) Inventor: Changhe Zhou, Shanghai (CN)

(73) Assignee: Shanghai Institute of Optics And Fine Mechanics, Chinese Academy of Sciences, Shanghai (CN)

( * ) Notice: Subject to any disclaimer, the term of this patent is extended or adjusted under 35 U.S.C. 154(b) by 775 days.

(21) Appl. No.: 17/120,074

(22) Filed: Dec. 11, 2020

(65) Prior Publication Data

US 2021/0096287 A1 Apr. 1, 2021

Related U.S. Application Data

(63) Continuation of application No. PCT/CN2019/122873, filed on Dec. 4, 2019.

(30) Foreign Application Priority Data

May 5, 2019 (CN) .......................... 201910368137.5

(51) Int. Cl.
  *G02B 5/18* (2006.01)
  *G02F 1/21* (2006.01)
  *G03F 7/00* (2006.01)

(52) U.S. Cl.
  CPC .................. *G02B 5/18* (2013.01); *G02F 1/21* (2013.01); *G03F 7/0005* (2013.01); *G03F 7/70466* (2013.01); *G02B 5/1857* (2013.01)

(58) Field of Classification Search
  CPC .... G02F 2203/54; G02F 2203/56; G02F 1/21; G02B 5/1857; G03F 7/0005; G03F 7/70466
  See application file for complete search history.

(56) References Cited

FOREIGN PATENT DOCUMENTS

| CN | 102289013 A | * 12/2011 |
|---|---|---|
| CN | 102289013 A | 12/2011 |

(Continued)

OTHER PUBLICATIONS

Chen, C. G., "Beam alignment and image metrology for scanning beam interference lithography: fabricating gratings with nanometer phase accuracy," doctoral dissertation of Massachusetts Institute of Technology (Jun. 2003).

(Continued)

*Primary Examiner* — Stephone B Allen
*Assistant Examiner* — Tamara Y. Washington
(74) *Attorney, Agent, or Firm* — Mei & Mark LLP; Manni Li

(57) ABSTRACT

A picometer optical comb and a device and a method for generating the same, wherein the picometer optical comb is a special grating with continuously variable widths of adjacent grating lines, wherein the width of each grating line is different from that of the adjacent grating line by a fixed difference in the magnitude of picometer to nanometer. The picometer optical comb provides a reference for picometer measurement. The picometer optical comb can generate a diffraction optical field distribution different from that of a traditional grating, which brings a new diffraction effect, achieves new diffraction optical functions, and provides tools such as picometer photolithography, picometer measurement, picometer imaging and the like. The picometer optical comb plays an important role in the fields of semiconductor photolithography, life science, interaction of light and substances in picometer scale.

6 Claims, 3 Drawing Sheets

(56) References Cited

FOREIGN PATENT DOCUMENTS

| | | |
|---|---|---|
| CN | 104765088 A | 7/2015 |
| CN | 107179576 A | 9/2017 |
| CN | 109696717 A | 4/2019 |
| JP | 2006072112 A | 3/2006 |

OTHER PUBLICATIONS

Xiansong Xiang et al., "Precision fringe period metrology using an LSQ sine fit algorithm," Applied Optics, Volv. 57, No. 17, pp. 4777-4784 (Jun. 10, 2018).

Xiansong Xiang et al., "Long-range in situ picometer measurement of the period of an interference field," Applied Optics, vol. 58, No. 11, pp. 2929-2935 (Apr. 10, 2019).

\* cited by examiner

PICOMETER OPTICAL COMB, AND DEVICE AND METHOD FOR GENERATING THE SAME

CROSS-REFERENCE TO RELATED APPLICATIONS

The subject application is a continuation of PCT/CN2019/122873 filed on Dec. 4, 2019, which claims priority on Chinese Application No. CN201910368137.5 filed on May 5, 2019 in China. The contents and subject matter of the PCT international application and Chinese priority application are incorporated herein by reference.

TECHNICAL FIELD

The present invention relates to a special grating, in particular, a picometer optical comb and device and method for generating the same.

BACKGROUND ART

Picometer-scale measurement is the current frontier of the science and technology. Advanced semiconductor photolithography technology has been able to process a node with several nanometers, which requires higher precision measurement technology to calibrate. That is, an optical technology based on several tens or several hundreds of picometers is required for the measurement. Therefore, the development of advanced picometer-scale optical measurement technology is the key to solve the problem of picometer measurement.

As the picometer scale is too small, there is no picometer measurement reference with a large range of motion that can be traced back. If a laser interferometer is used, the measurement reliability of the laser interferometer on the picometer scale is lowered due to inherent error sources of the laser interferometer, such as laser wavelength fluctuation, electronic noise, optical nonlinearity, etc., and also the influence of environmental factors, such as air disturbance, material thermal expansion, optical thermal drift, etc. Assuming that the subdivision factor of the electronic signal is too high, a measurement signal will be particularly sensitive to noise, including electronic noise, optical instability, and environmental interference noise, so that a variance of the laser interferometer for the picometer measurement is too large, i.e., the reliability is poor. If the structure of the Fabry-Perot cavity is adopted to carry out the picometer measurement, a picometer magnitude signal may be obtained, but the method is difficult to apply to a large measurement range, namely, it is impossible to meet the requirement of large-range high-precision measurement needed by the semiconductor photolithography. The high-precision measurement of a single point can be obtained if a laser interference technology similar to laser gravitational wave measurement is adopted. However, the high-precision measurement of the single point is difficult to solve the large-range measurement requirement of the semiconductor photolithography.

It is known that a two-beam interference laser field is measured by a prism method in the process of developing a large-size grating laser direct writing device (Nanoruler) by Massachusetts Institute of Technology, and the measurement accuracy of the grating interference field reaches a picometer level. See Chen C G., "Beam alignment and image metrology for scanning beam interference lithography: fabricating gratings with nanometer phase accuracy," a doctoral dissertation of Massachusetts Institute of Technology (2003). A high-precision two-dimensional movable platform is utilized by the Shanghai Institute of Optics and Fine Mechanics, so that the grating field measurement precision reaches the picometer level (See Applied Optics 57, 4777-4784 (2018)); and picometer measurement results of a long-range (60 mm) laser interference field are obtained using a scanning grating technology (See Applied Optics 58, 2929-2935(2019)).

Whether the above mentioned technologies are used, the grating field with picometer measurement accuracy can be obtained, the period of which is based on the magnitude of a few hundred nanometers. In particular with the article at Applied Optics 58, 2929-2935(2019), it is undoubtedly very important to develop wide-range precision measuring technologies, in which the width of all grating grooves is assumed to be uniform, with the magnitude of a few hundred nanometers. However, in view of a single groove shape, a measurement reference on the picometer magnitude cannot be provided.

It can be intuitively understood that although the above mentioned technologies all provide periodic measurements with picometer accuracy, they do not provide differences between different gratings. If a picometer-scale difference between two high-density gratings can be obtained, it is possible to develop a new picometer-scale optical measurement technology.

SUMMARY OF THE PRESENT INVENTION

The present invention provides a picometer optical comb and device and method for generating the same. The picometer optical comb of the present invention is particularly useful in providing a reference for picometer measurement. The picometer optical comb of the present invention generates a diffraction optical field distribution that is different from that of a traditional grating, which brings a new diffraction effect, achieves new diffraction optical functions, and provides tools for picometer photolithography, picometer measurement, picometer imaging, etc. Therefore, the picometer optical comb plays an important role in studying interaction in picometer scale the fields of semiconductor photolithography, life science, and light and material.

To achieve the above object, the technical solution of the present invention is as follows.

The present invention provides a picometer optical comb, wherein the picometer optical comb has a period d and width of adjacent grating lines difference $\Delta d$, and values of $\Delta d$ in the widths of adjacent grating lines range from a picometer to a nanometer magnitude.

In the present invention, the width of the grating groove is continuously modulated with picometer precision between adjacent grating lines, distributed over different grating lines, as if combs of continuously variable width placed over different grating lines, and similar to the concept of optical frequency combs. Therefore, they are called picometer optical combs.

The present invention also provides a device for generating the picometer optical comb, comprising an interference optical field generating module, an interference optical field modulating module, and a grating pitch measuring module, wherein the interference optical field modulating module is a tunable part of the interference optical field generating module, and the grating pitch measuring module comprises an interference coherent measuring apparatus, a laser interferometer, and a computer. In a first embodiment, the interference optical field generating module is a laser holographic exposure device, and the interference optical field modulating module is a tunable part of the laser holographic exposure device. In a second embodiment, the interference optical field generating module is a laser direct writing device, and the interference optical field modulating module is a tunable part of the laser direct writing device.

The present invention further provides methods for generating the picometer optical comb by using the devices. In the method using the device of the first embodiment, it comprises the steps of (1) preparing a picometer optical comb substrate by placing a substrate to be exposed on a grating base, adjusting an included angle between a left light beam (101) and a right light beam (102) by measurement of the grating pitch measuring module and a tunable part of the laser holographic exposure device so that the period of a grating formed by the left light beam (101) and the right light beam (102) is d, and the grating with the period d is written by a primary exposure; after the exposure, adjusting the left light beam (101) or the right light beam (102), so that the period of the grating formed by the left light beam (101) and the right light beam (102) is d+$\Delta$d, wherein $\Delta$d is a picometer magnitude;

(2) before the secondary exposure, adjusting an exposure amount of the secondary exposure to obtain the picometer optical combs with different grating groove widths being the picometer optical comb substrates with following different ratios f1/f2 of groove width to period:

(i) if the two exposure amounts are equal or close to each other, the situation that the grating grooves or grating lines are close to each other occurs; for example, if f1=f2=0.5, the widths of the grating lines are continuously increased or decreased; and the widths of the grating lines are, from $\Delta$d, 2$\Delta$d, 3$\Delta$d, . . . , etc. to a maximum value, for example, d/2, gradually decreased to . . . , 3$\Delta$d, 2$\Delta$d, $\Delta$d, etc. to complete a period of the picometer optical comb;

(ii) if the two exposure amounts are large, an overexposure situation occurs; at the moment, both f1 and f2 are large, the situation that only one grating groove exists in one period d occurs; with the increase of the period, the width of the grating groove is gradually decreased, and two grating grooves appear from a certain period; the width of one of the grating lines is smaller and the width of the other is larger, and then, with the further increase of the period d, the width of the grating line which starts to be smaller is gradually increased, and the grating line is increased by $\Delta$d after each period; the width of the grating line which starts to be larger is gradually decreased, and the grating line is decreased by $\Delta$d after each period; in a specific certain period d, a situation that two grating grooves are basically equal in one period occurs, namely a situation of frequency doubling occurs; with the further increase of the period, one will be gradually increased, and with each increase of the period, it is increased by $\Delta$d; and the other one will be gradually decreased, wherein the gradually increased one will occupy a most part of one period, and the other gradually decreased one will be decreased by $\Delta$d with each increase of the period until the one will disappear completely;

(iii) when the secondary exposure is insufficient, the situation that both f1 and f2 are small occurs; at the moment, only one grating groove may exist in each period of the picometer optical comb, and each grating groove is different from an adjacent grating groove by $\Delta$d; and if it is calculated from a maximum grating groove, the grating groove is monotonically decreased with the increase of the grating period until the grating groove will disappear completely;

(3) performing the secondary exposure, obtaining a grating with a period of d+$\Delta$d after the secondary exposure, and obtaining an exposure substrate of the picometer optical comb from a combination of the two exposures, which is a picometer optical comb substrate for short; and (4) developing, fixing, and drying the picometer optical comb substrate to obtain the picometer optical comb.

In the method for generating the picometer optical comb by using the device of the second embodiment, the method comprises the steps of (1) preparing a picometer optical comb substrate by placing a substrate to be exposed on a grating base, generating a grating field with a period d by measurement of a grating pitch measuring module and the adjustable part of the laser direct writing device, performing a primary exposure and writing out a grating with the period d, and adjusting the interference optical field adjusting module and the measuring module after the exposure to form the grating with the period d+$\Delta$d;

(2) before the secondary exposure, adjusting an exposure amount of the secondary exposure to obtain the picometer optical combs with different grating groove widths being the picometer optical comb substrates with the following different ratios f1/f2 of groove width to period:

(i) if the two exposure amounts are equal or close to each other, the situation that the grating grooves or the grating lines are close to each other occurs; for example, if f1=f2=0.5, the widths of the grating lines continuously increase or decrease; and the widths of the grating lines are, from $\Delta$d, 2$\Delta$d, 3$\Delta$d, . . . , etc. to a maximum value, for example, d/2, gradually decreased to . . . , 3$\Delta$d, 2$\Delta$d, $\Delta$d, etc. to complete a period of the picometer optical comb;

(ii) if the two exposure amounts are large, an overexposure situation occurs; at the moment, both f1 and f2 are large, the situation that only one grating groove exists in one period d occurs; with the increase of the period, the width of the grating groove is gradually decreased, and two grating grooves appear from a certain period; the width of one of the grating lines is smaller and the width of the other is larger, and then, with the further increase of the period d, the width of the grating line which starts to be smaller is gradually increased, and the grating line is increased by $\Delta$d after each period; the width of the grating line which starts to be larger is gradually decreased, and the grating line is decreased by $\Delta$d after each period; in a specific certain period d, a situation that two grating grooves are basically equal in one period occurs, namely a situation of frequency doubling occurs; with the further increase of the period, one will gradually increase, and with each increase of the period, it is increased by $\Delta$d; and the other one will be gradually decreased, wherein the gradually increased one will occupy a most part of one period, and the other gradually decreased one will be decreased by $\Delta$d with each increase of the period until the one will disappear completely;

(iii) when the secondary exposure is insufficient, the situation that both f1 and f2 are small occurs; at the moment, only one grating groove may exist in each period of the picometer optical comb, and each grating groove is different from an adjacent grating groove by $\Delta d$; and if it is calculated from a maximum grating groove, the grating groove is monotonically decreased with the increase of the grating period until the grating groove will disappear completely;

(3) performing the secondary exposure, obtaining a grating with a period of $d+\Delta d$ after the secondary exposure, and obtaining an exposure substrate of the picometer optical comb from a combination of the two exposures, which is a picometer optical comb substrate for short; and (4) developing, fixing, and drying the picometer optical comb substrate to obtain the picometer optical comb. The present invention has the following technical effects.

The picometer optical comb of the present invention provides a reference for picometer measurement. The picometer optical comb generates a diffraction optical field distribution that is different from that of a traditional grating, which brings a new diffraction effect, achieves new diffraction optical functions, and provides tools such as picometer photolithography, picometer measurement, picometer imaging etc. Therefore, the picometer optical comb plays an important role in studying interaction in picometer scale in the fields of semiconductor photolithography, life science, and light and substances.

DETAILED DESCRIPTION OF THE PRESENT INVENTION

Figure 2:
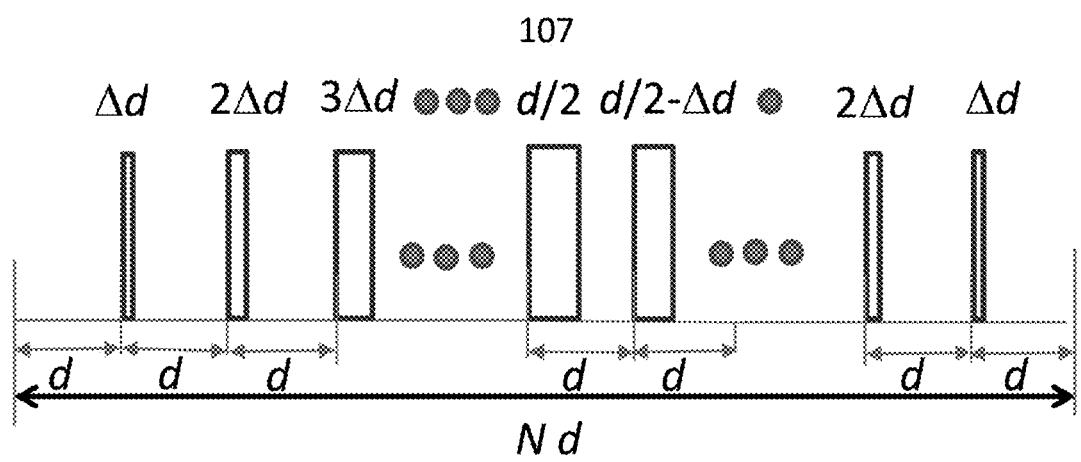
FIG. 2 shows the first embodiment of the picometer optical comb of the present invention.

As shown in FIG. 2, the picometer optical comb 107 shows that the grating groove has continuously variable opening ratios; with each increased distance d, the width of the grating groove is increased or decreased by $\Delta d$. One possibility is that in a first half period ($N \cdot d/2$), the width of the grating groove is continuously increased with the increase of the period; in a second half period, the width of the grating groove is decreased continuously with the increase of the period.

As shown in FIG. 2, the picometer optical comb of the present invention is characterized in that a period of the comb is d, widths of adjacent grating lines have a picometer scale difference, and values of $\Delta d$ range from a picometer to a nanometer magnitude. The picometer optical comb is a special grating with a groove shape width continuously varied between adjacent grating lines.

The width of each grating groove of the grating is increased or decreased by a fixed difference compared with the width of an adjacent grating groove, for example, $\Delta d$, Namely, if the groove width of a certain grating line is Xn, the groove width $X_{(n+1)}$ of a next grating line is $$X_{(n+1)} = X_n + \Delta d \quad (1) \text{ or}$$

$$X_{(n+1)} = X_n - \Delta d \quad (2)$$

The width $X_{(n+2)}$ of one after the next grating line is $$X_{(n+2)} = X_n + 2\Delta d \quad (3)$$

$$X_{(n+2)} = X_n - 2\Delta d \quad (4)$$

and so on, if N grating lines are crossed, then $$X_{(n+N)} = X_n + N \cdot \Delta d \quad (5)$$

$$X_{(n+N)} = X_n - N \cdot 2\Delta d \quad (6)$$

Due to the repeatability of the grating, such a structure is like combs of different widths are placed on adjacent grating lines. Therefore, assuming that the period of the grating is d, if the number of grating lines is greater than $N > d/\Delta d$, the picometer optical comb field is repeated, which is called a picometer optical comb period, and one situation of a single picometer period is shown in FIG. 2.

The present invention further provides a device for generating the picometer optical comb of the present invention. The device for generating the picometer optical comb comprises an interference optical field generating module, an interference optical field modulating module, and a grating pitch measuring module.

In a first embodiment of the device for generating the picometer optical comb in the present invention, the device is characterized in that the interference optical field generating module is a laser holographic exposure device; the interference optical field modulating module is a tunable part of the laser holographic exposure device; and the grating pitch measuring module comprises an interference coherent measuring apparatus, a laser interferometer, and a computer.

In a second embodiment of the device for generating the picometer optical comb in the present invention, the device is characterized in that the interference optical field generating module is a laser direct writing device, the interference optical field modulating module is an adjustable part of the laser direct writing device, and the grating pitch measuring module comprises an interference coherent measuring apparatus, a laser interferometer, and a computer.

The second part is a high-density grating field measuring device of which measurement precision must reach picometer precision. The picometer-precision grating field measuring device has at least two measuring means: the first measuring means is an interference field measuring technology adopting a prism method as shown in the Chen article (2003) and Applied Optics 57, 4777-4784 (2018) as discussed above. The second measuring means is a high-density grating interference field measuring technology using the scanning grating as shown in Applied Optics 58, 2929-2935(2019) as discussed above.

The third part is an adjusting device for the high-density grating interference field. If the first traditional laser holographic device is adopted, the period of the high-density grating interference field can be adjusted by adjusting an included angle between two beams of the laser holography. The period of the interference field from nanometer to picometer can be finely adjusted by feeding back and correcting the included angle between the two beams according to the measurement results of the high-density grating field of the second part.

The present invention further provides method for generating the picometer optical comb by using the device.

Figure 1:
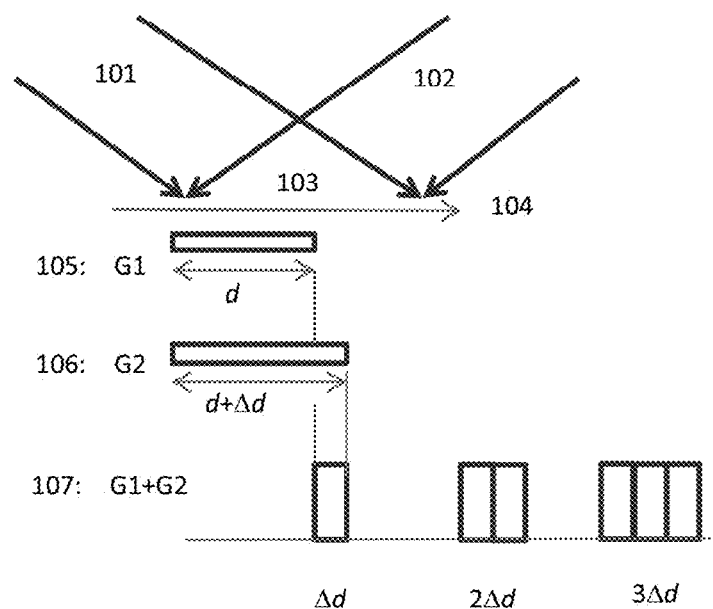
FIG. 1 shows one embodiment of the present invention where the secondary holographic exposure method is used for generating the picometer grating.

In the first embodiment of the method for generating the picometer optical comb, the method uses a laser holographic secondary exposure method. FIG. 1 shows the secondary holographic exposure method in the present invention, where 101 is a left light beam of a holographic recording system; 102 is a right light beam; 103 is a grating field formed by the coherent interference of the left light beam 101 with the right light beam 102; 104 is a precision measuring device of a holographic interference grating field period; 105 is a schematic diagram of a primary exposure interference field; 106 is a schematic diagram of a secondary exposure interference field; and 107 is a picometer optical comb formed by a slightly different secondary exposure of the grating period. The method comprises the following steps:

(1) preparing a picometer optical comb substrate: placing a substrate to be exposed on a grating base, adjusting an included angle between the left light beam 101 and the right light beam 102 by measurement of a grating pitch measuring module and a tunable part of a laser holographic exposure device as shown in FIG. 1 so that the period of a grating formed by the left light beam 101 and the right light beam 102 is d, and the grating with the period d is written by a primary exposure; after the exposure, adjusting the left light beam 101 or the right light beam 102, so that the period of the grating formed by the left light beam 101 and the right light beam 102 is $d+\Delta d$, wherein $\Delta d$ is a picometer magnitude;

(2) before the secondary exposure, adjusting an exposure amount of the secondary exposure to obtain the picometer optical combs with different grating groove widths, namely, the picometer optical comb substrates with following different ratios f1/f2 of groove width to period:

(i) if the two exposure amounts are equal or close to each other, the situation that the grating grooves or the grating lines are close to each other occurs; for example, if f1=f2=0.5, the widths of the grating lines are continuously increased or decreased; and the widths of the grating lines are, from $\Delta d$, $2\Delta d$, $3\Delta d$, ..., etc. to a maximum value, for example, d/2, gradually decreased to ..., $3\Delta d$, $2\Delta d$, $\Delta d$, etc. to complete a period of the picometer optical comb;

(ii) if the two exposure amounts are large, an overexposure situation occurs; at the moment, both f1 and f2 are large, the situation that only one grating groove exists in one period d occurs; with the increase of the period, the width of the grating groove gradually decreases, and two grating grooves appear from a certain period; the width of one of the grating lines is smaller and the width of the other is larger, and then, with the further increase of the period d, the width of the grating line which starts to be smaller gradually increases, and the grating line is increased by $\Delta d$ after each period; the width of the grating line which starts to be larger gradually decreases, and the grating line is decreased by $\Delta d$ after each period; in a specific certain period d, a situation that two grating grooves are basically equal in one period occurs, namely a situation of frequency doubling occurs; with the further increase of the period, one will be gradually increased, and with each increase of the period, it is increased by $\Delta d$; and the other one will be gradually decreased, wherein the gradually increased one will occupy a most part of one period, and the other gradually decreased one will be decreased by $\Delta d$ with each increase of the period until the one will disappear completely;

(iii) when the secondary exposure is insufficient, the situation that both f1 and f2 are small occurs; at the moment, only one grating groove may exist in each period of the picometer optical comb, and each grating groove is different from an adjacent grating groove by $\Delta d$; and if it is calculated from a maximum grating groove, the grating groove is monotonically decreased with the increase of the grating period until the grating groove will disappear completely;

(3) performing the secondary exposure, obtaining a grating with a period of $d+\Delta d$ after the secondary exposure, and obtaining an exposure substrate of the picometer optical comb from a combination of the two exposures, which is a picometer optical comb substrate for short; and (4) developing, fixing and drying the picometer optical comb substrate to obtain the picometer optical comb 107.

In the second embodiment of the method for generating the picometer optical comb, the method uses the device for generating the picometer optical comb by adopting the secondary exposure method of the laser direct writing technology and comprises the following steps:

(1) preparing a picometer optical comb substrate:

placing a substrate to be exposed on a grating base, generating a grating field with a period d by measurement of a grating pitch measuring module and the adjustable part of the laser direct writing device, performing a primary exposure and writing out a grating with the period d, and adjusting the interference optical field adjusting module and the measuring module after the exposure to form the grating with the period $d+\Delta d$;

(2) before the secondary exposure, adjusting an exposure amount of the secondary exposure to obtain the picometer optical combs with different grating groove widths, namely the picometer optical combs with following different ratios f1/f2 of groove width to period:

(i) if the two exposure amounts are equal or close to each other, the situation that the grating grooves or the grating lines are close to each other occurs; for example, if f1=f2=0.5, the widths of the grating lines continuously increase or decrease; and the widths of the grating lines are, from $\Delta d$, $2\Delta d$, $3\Delta d$, ..., etc. to a maximum value, for example, d/2, gradually decreased to ..., $3\Delta d$, $2\Delta d$, $\Delta d$, etc. to complete a period of the picometer optical comb;

(ii) if the two exposure amounts are large, an overexposure situation occurs; at the moment, both f1 and f2 are large, the situation that only one grating groove exists in one period d occurs; with the increase of the period, the width of the grating groove is gradually decreased, and two grating grooves appear from a certain period; the width of one of the grating lines is smaller and the width of the other is larger, and then, with the further increase of the period d, the width of the grating line which starts to be smaller is gradually increased, and the grating line is increased by $\Delta d$ after each period; the width of the grating line which starts to be larger is gradually decreased, and the grating line is decreased by $\Delta d$ after each period; in a specific certain period d, a situation that two grating grooves are basically equal in one period occurs, namely a situation of frequency doubling occurs; with the further increase of the period, one will be gradually increased, and with each increase of the period, it is increased by $\Delta d$; and the other one will be gradually decreased, wherein the gradually increased one will occupy a most part of one period, and the other gradually decreased one will be decreased by $\Delta d$ with each increase of the period until the one will disappear completely;

(iii) when the secondary exposure is insufficient, the situation that both f1 and f2 are small occurs; at the moment, only one grating groove may exist in each period of the picometer optical comb, and each grating groove is different from an adjacent grating groove by $\Delta d$; and if it is calculated from a maximum grating groove, the grating groove is monotonically decreased with the increase of the grating period until the grating groove will disappear completely;

(3) performing the secondary exposure, obtaining a grating with a period of d+$\Delta d$ after the secondary exposure, and obtaining an exposure substrate of the picometer optical comb from a combination of the two exposures, which is a picometer optical comb substrate for short; and (4) developing, fixing and drying the picometer optical comb substrate to obtain the picometer optical comb 107.

The exposure field of the picometer optical comb can be obtained by a conventional laser holographic secondary exposure system, as shown in FIG. 1. Before the primary holographic exposure, a fringe period of a laser holographic interference field is measured, for example, the period of a grating is d. When the primary exposure is carried out, the left light beam 101 and the right light beam 102 of the holographic exposure system are adjusted, a interference field 103 of the primary holographic exposure is recorded on a photoresist; and the left light beam 101 or the right light beam 102 of the holographic exposure system are adjusted after the exposure to obtain the fringe period d+$\Delta d$ of the resulting secondary holographic interference field, where $\Delta d$ can range from picometers to nanometers. By the secondary exposure technology, the grating distribution with a phase difference $\Delta d$ of adjacent regions of the grating lines is recorded on the photoresist, so that a periodic distribution of the adjacent continuous change of the grating lines, namely the picometer optical comb, is obtained.

The grating period precision measuring device 104 of the holographic interference system employs the technology in Applied Optics 58, 2929-2935(2019) as discussed above. This process is as follows: firstly, a carrier grating is made by exposing a grating on a substrate coated with photoresist by using a two-beam laser interference field; and a grating with the same period as the interference field is obtained by developing, fixing and drying, wherein the grating is called a carrier grating. Next, zero-order or -1-order diffracted lights of the left light beam 101 or the right light beam 102 of the two-beam exposure field are combined by using this carrier grating to form an interference signal. By placing a detector in a diffraction direction of the interference signal, the intensity of the interference signal can be detected. When the carrier grating and the detector move together, the periodic distribution of the laser interference field can be accurately measured. Because the movable platform is synchronously measured by the laser interferometer all the time, the fringe number and specific position of the interference signals can be obtained by the position information measured by the laser interferometer. Since the high-precision position information of the carrier grating can be obtained by the laser interferometer, the picometer precision distribution of the period of the two-beam interference field can be obtained by calculation of the fringe distribution of the two-beam interference field. With this carrier grating technology, an accurate value of the grating period of the interference exposure field can be measured.

By accurately adjusting the included angle distribution of laser holographic interference, different gratings having the period with the picometer precision can be obtained. Using the secondary exposure technology, the optical field distribution of the picometer optical comb 107 can be obtained.

The picometer optical comb can also be obtained by the secondary exposure technology of the laser direct writing system.

It is known that it is not possible to write the optical field of the picometer optical comb directly at one time using the laser writing system. There are two reasons. First, current measurement and feedback control systems for laser interferometers are unlikely to provide positioning accuracy at the magnitude of picometers, especially over large scale ranges, such as millimeters or several hundred millimeters. Second, the control technology of the size and intensity of the laser beam is difficult to make a continuously adjustable picometer-precision optical field.

The present invention discloses a picometer optical comb generated by the laser direct writing system, which comprises the following steps:

(1) firstly writing out a grating with a grating period d by the laser direct writing system, and accurately measuring the grating period by adopting the prior art 1 or 2; and obtaining an accurate mask plate with a grating period d after a primary exposure;

(2) adjusting a step pitch of the movable platform of the laser direct writing system, so that a grating with the grating period d+$\Delta d$ can be written out; at the moment, carrying out a secondary exposure; and after the secondary exposure, developing, fixing, drying and other steps to obtain the optical field distribution of the picometer optical comb.

For a grating with a grating period d=1000 nm, assuming a fixed difference $\Delta d$=100 pm between the grating lines, the groove width between adjacent grating lines is continuously increased or decreased by 100 pm; and when N (=10000) grating lines are continuously increased or decreased, i.e. after passing through a 10 mm grating, the increase or decrease distribution of the grating lines is repeated, and the period of the picometer optical comb is 10 mm.

The picometer optical comb has multiple expression forms.

Example 1

Assuming that the picometer optical comb is produced by two holographic exposures, the generating process using holographic two-beam exposure is as shown in FIG. 1, the grating 105 period for the primary exposure is d and the grating period for the secondary exposure is d+$\Delta d$; if the two exposures and the developing process are matched, resulting in both aperture efficiencies of the two-exposure gratings being f1=f2=0.5 (where the aperture efficiency is defined as a ratio of grating groove to period), a picometer optical comb with continuously varied grating pitches is generated as shown in FIG. 2, which varies over a complete picometer optical comb period N·d as shown in FIG. 2.

Here, the aperture efficiencies f1 and f2 are related to the amount of secondary exposure, the degree of development, etc. The specific numbers of f1 and f2 can be calibrated in advance by setting a relationship between the exposure amount and the development amount.

Figure 3:
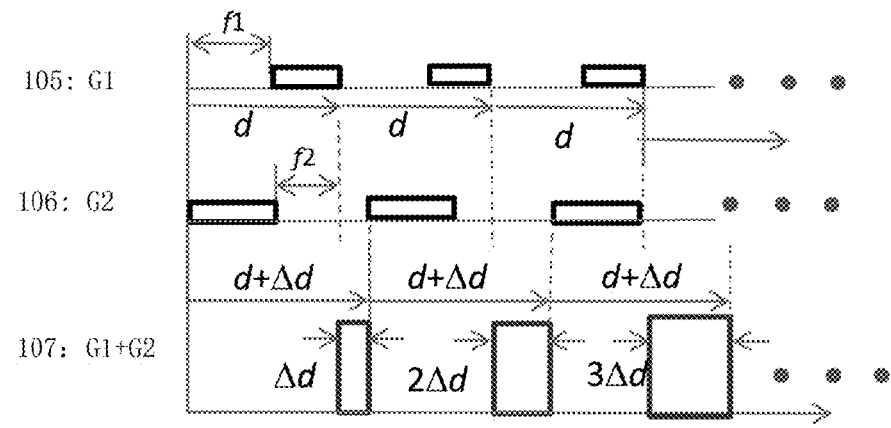
FIG. 3 shows partial grating pitch variation process in the first embodiment of the picometer optical comb of the present invention.

One complete picometer optical comb period is distributed on N grating lines, a minimum width of the groove shape is Δd, the width of an adjacent groove shape is 2Δd, and the width of a third groove shape is 3Δd. The change process of local grating lines is shown in FIG. 3. FIG. 3 shows partial grating pitch variation process in the embodiment of the picometer optical comb of the present invention; the secondary exposure of the gratings 105, 106 with opening ratios f1=f2=0.5 in different periods results in a picometer optical comb 107 having continuously variable pitches, with a period N·d and an overall picometer optical comb distribution as shown in FIG. 2. The width of the groove shape thereof is increased by Δd after each grating period is increased; when a maximum width d/2 of the groove shape is reached, it will be decreased therewith, and the width of the adjacent groove shape is d/2−Δd; for each subsequent increase in grating period, the groove width is decreased by Δd until it is decreased to Δd. This process is repeated after a picometer optical comb period N·d.

Example 2

Figure 4:
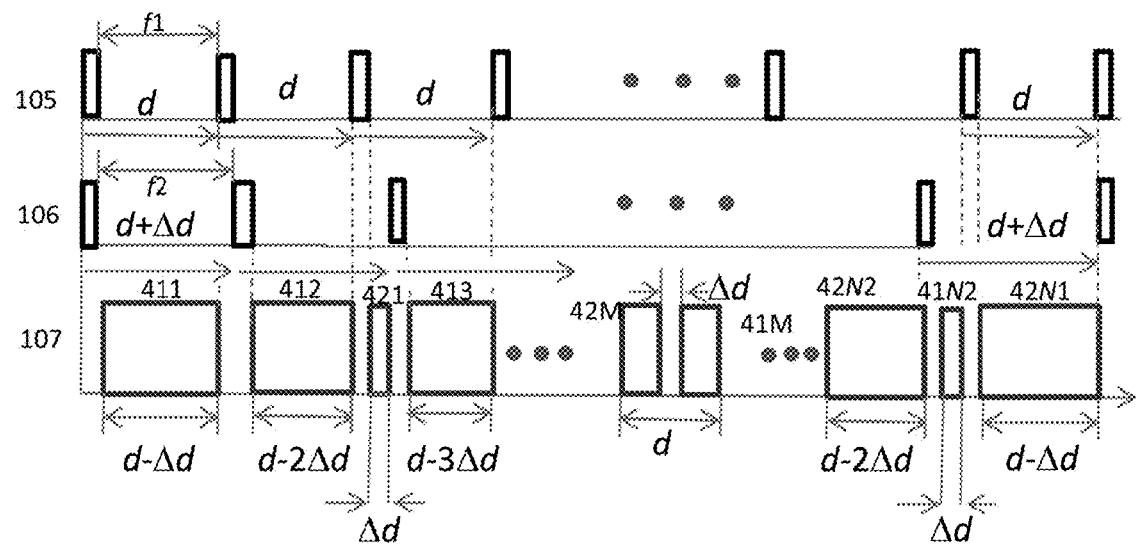
FIG. 4 shows the second embodiment of the picometer optical comb of the present invention.

It is also possible for the picometer optical comb to have f1 and f2 both being large due to two exposures. In the second embodiment of the picometer optical comb of the present invention as shown in FIG. 4, the optical field distribution of the picometer optical comb 107 is formed by the secondary exposure of the gratings 105,106. If both f1 and f2 of the secondary exposure are larger, a wider groove shape is formed, e.g., 411, 412, resulting in a smaller groove shape 421 with the further increase of grating period, and also another grating groove 413 appears in the period. Subsequently, with the increase of the grating period increases, there occurs a situation in which there are two groove shapes 42M and 41M in a period, and 42M and 41M are almost equal, that is, a frequency doubling effect. Finally, with the increase of the period, the width of a 42N2 groove shape further increases to 42N1, reaching a maximum value d−Δ. At the same time, the width of 41N2 adjacent to 42N1 and 42N2 is also a minimum value Δd, which is also a possible picometer optical comb distribution.

As shown in FIG. 4, it is possible to have only one groove shape distribution in one period, e.g., 411, 412, etc., or two distributions, e.g., 42M and 41M in one period. This means that the frequency doubling effect of the picometer optical comb is likely to occur when f1 and f2 are both large. Finally, it may occur that the groove shape widths 42N2 and 42N1 are gradually increased.

Example 3

Figure 5:
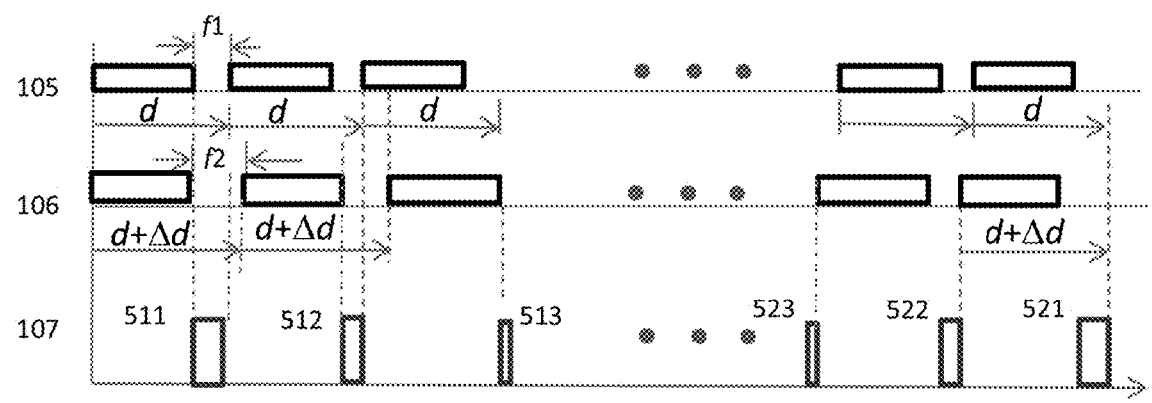
FIG. 5 shows the third embodiment of the picometer optical comb of the present invention.

In the present invention, it is also possible for the picometer optical comb to have both f1 and f2 being small. As shown in FIG. 5, in the third embodiment of the picometer optical comb 107 of the present invention, if f1 and f2 of the secondary exposure are both small, a grating groove with different widths of 511, 512, 513, etc. is formed; and with the increase of the period, the groove shape width of 511, 512, and 513 gradually decreases, so that after a certain period, the grating groove completely disappears, resulting in a part of the area having no grating at all. Finally, grating grooves such as 523, 522, 521, etc. also appear, and with the increase of the period, the groove shape width of 523, 522, and 521 gradually increases.

For example, f1<f2<0.5, and it is possible to have only one groove shape in one period, e.g., 511, 512, 513, etc., the width of which is gradually decreased. Even a segment in the middle has no grating; and finally, it is also possible that groove shapes 523, 522, 521, etc. may occur within one period, the width of which is gradually increased.

Of course, there are more possibilities for f1 and f2 distributions in other situations.

Since the period of the primary exposure and the period of the secondary exposure can be accurately measured to reach the picometer magnitude, the accurate groove shape distribution of the picometer optical comb can be obtained by setting the difference of the grating period in the two exposures by means of the secondary exposure technology and changing the period of the secondary exposure, wherein the width of each groove has a difference accurately controlled at the picometer magnitude relative to the groove shape of a adjacent period. Therefore, a variety of situations are possible, such as those shown in FIGS. 3, 4, and 5.

The picometer optical comb of the present invention is a novel grating apparatus. Since the width of a grating line in adjacent periods can be accurately controlled at the magnitude of picometer change, the picometer optical comb provided by the present invention provides a reference for picometer measurement. The picometer optical comb can generate a diffraction optical field distribution different from that of a traditional grating, which brings a new diffraction effect, achieves new diffraction optical functions, and provides tools such as picometer photoetching, picometer measurement, picometer imaging and the like. Therefore, the picometer optical comb can play an important role in the fields of semiconductor photoetching, life science, interaction of light and substances in picometer scale and the like.

I claim:

1. A picometer optical comb, comprising a period d, and grating lines with continuously variable widths,
   wherein a width of each grating line is different from a width of an adjacent grating line in the picometer optical comb by a fixed difference Δd, and value of Δd is in a magnitude of picometer to nanometer.

2. A device for generating a picometer optical comb, comprising
   an interference optical field generating module,
   an interference optical field modulating module, and
   a grating pitch measuring module,
   wherein the picometer optical comb has a period d and grating lines with continuously variable widths, a width of a grating line differs from a width of an adjacent grating line by a fixed difference Δd, and value of Δd is in a magnitude of picometer to nanometer,
   the interference optical field modulating module is a tunable part of the interference optical field generating module, and
   the grating pitch measuring module comprises an interference coherent measuring apparatus, a laser interferometer, and a computer.

3. The device of claim 2, wherein the interference optical field generating module is a laser holographic exposure device, and the interference optical field modulating module is a tunable part of the laser holographic exposure device.

4. A method for generating the picometer optical comb by using the device of claim 3, comprising
   (1) preparing a picometer optical comb substrate by placing a substrate to be exposed on a grating base, adjusting an included angle between a left light beam (101) and a right light beam (102) by measurement of the grating pitch measuring module and a tunable part of the laser holographic exposure device so that the period of a grating formed by the left light beam (101) and the right light beam (102) is d, and the grating with the period d is written by a primary exposure; after the exposure, adjusting the left light beam (101) or the right light beam (102), so that the period of the grating formed by the left light beam (101) and the right light beam (102) is d+Δd, wherein Δd is a picometer magnitude;

(2) before the secondary exposure, adjusting an exposure amount of the secondary exposure to obtain the picometer optical combs with different grating groove widths being the picometer optical comb substrates with following different ratios f1/f2 of groove width to period:
  (i) if the two exposure amounts are equal or close to each other, the situation that the grating grooves or grating lines are close to each other occurs; for example, if f1=f2=0.5, the widths of the grating lines are continuously increased or decreased; and the widths of the grating lines are, from Δd, 2Δd, 3Δd, ..., etc. to a maximum value, for example, d/2, gradually decreased to ..., 3Δd, 2Δd, Δd, etc. to complete a period of the picometer optical comb;
  (ii) if the two exposure amounts are large, an overexposure situation occurs; at the moment, both f1 and f2 are large, the situation that only one grating groove exists in one period d occurs; with the increase of the period, the width of the grating groove is gradually decreased, and two grating grooves appear from a certain period; the width of one of the grating lines is smaller and the width of the other is larger, and then, with the further increase of the period d, the width of the grating line which starts to be smaller is gradually increased, and the grating line is increased by Δd after each period; the width of the grating line which starts to be larger is gradually decreased, and the grating line is decreased by Δd after each period; in a specific certain period d, a situation that two grating grooves are basically equal in one period occurs, namely a situation of frequency doubling occurs; with the further increase of the period, one will be gradually increased, and with each increase of the period, it is increased by Δd; and the other one will be gradually decreased, wherein the gradually increased one will occupy a most part of one period, and the other gradually decreased one will be decreased by Δd with each increase of the period until the one will disappear completely;
  (iii) when the secondary exposure is insufficient, the situation that both f1 and f2 are small occurs; at the moment, only one grating groove may exist in each period of the picometer optical comb, and each grating groove is different from an adjacent grating groove by Δd; and if it is calculated from a maximum grating groove, the grating groove is monotonically decreased with the increase of the grating period until the grating groove will disappear completely;

(3) performing the secondary exposure, obtaining a grating with a period of d+Δd after the secondary exposure, and obtaining an exposure substrate of the picometer optical comb from a combination of the two exposures, which is a picometer optical comb substrate for short; and (4) developing, fixing, and drying the picometer optical comb substrate to obtain the picometer optical comb.

5. The device of claim 2, wherein the interference optical field generating module is a laser direct writing device, and the interference optical field modulating module is a tunable part of the laser direct writing device.

6. A method for generating the picometer optical comb by using the device of claim 5, comprising
(1) preparing a picometer optical comb substrate by placing a substrate to be exposed on a grating base, generating a grating field with a period d by measurement of a grating pitch measuring module and the adjustable part of the laser direct writing device, performing a primary exposure and writing out a grating with the period d, and adjusting the interference optical field adjusting module and the measuring module after the exposure to form the grating with the period d+Δd;
(2) before the secondary exposure, adjusting an exposure amount of the secondary exposure to obtain the picometer optical combs with different grating groove widths being the picometer optical comb substrates with the following different ratios f1/f2 of groove width to period:
  (i) if the two exposure amounts are equal or close to each other, the situation that the grating grooves or the grating lines are close to each other occurs; for example, if f1=f2=0.5, the widths of the grating lines continuously increase or decrease; and the widths of the grating lines are, from Δd, 2Δd, 3Δd, ..., etc. to a maximum value, for example, d/2, gradually decreased to ..., 3Δd, 2Δd, Δd, etc. to complete a period of the picometer optical comb;
  (ii) if the two exposure amounts are large, an overexposure situation occurs; at the moment, both f1 and f2 are large, the situation that only one grating groove exists in one period d occurs; with the increase of the period, the width of the grating groove is gradually decreased, and two grating grooves appear from a certain period; the width of one of the grating lines is smaller and the width of the other is larger, and then, with the further increase of the period d, the width of the grating line which starts to be smaller is gradually increased, and the grating line is increased by Δd after each period; the width of the grating line which starts to be larger is gradually decreased, and the grating line is decreased by Δd after each period; in a specific certain period d, a situation that two grating grooves are basically equal in one period occurs, namely a situation of frequency doubling occurs; with the further increase of the period, one will gradually increase, and with each increase of the period, it is increased by Δd; and the other one will be gradually decreased, wherein the gradually increased one will occupy a most part of one period, and the other gradually decreased one will be decreased by Δd with each increase of the period until the one will disappear completely;
  (iii) when the secondary exposure is insufficient, the situation that both f1 and f2 are small occurs; at the moment, only one grating groove may exist in each period of the picometer optical comb, and each grating groove is different from an adjacent grating groove by Δd; and if it is calculated from a maximum grating groove, the grating groove is monotonically decreased with the increase of the grating period until the grating groove will disappear completely;
(3) performing the secondary exposure, obtaining a grating with a period of d+Δd after the secondary exposure, and obtaining an exposure substrate of the picometer optical comb from a combination of the two exposures, which is a picometer optical comb substrate for short; and (4) developing, fixing, and drying the picometer optical comb substrate to obtain the picometer optical comb.

\* \* \* \* \*